US005755859A

United States Patent [19]
Brusic et al.

[11] Patent Number: 5,755,859
[45] Date of Patent: May 26, 1998

[54] COBALT-TIN ALLOYS AND THEIR APPLICATIONS FOR DEVICES, CHIP INTERCONNECTIONS AND PACKAGING

[75] Inventors: Vlasta A. Brusic, Amawalk; Jeffrey Robert Marino, Fishkill; Eugene John O'Sullivan, Nyack; Carlos Juan Sambucetti, Croton-on-Hudson; Alejandro Gabriel Schrott, New York; Cyprian Emeka Uzoh, Hopewell Junction, all of N.Y.

[73] Assignee: International Business Machines Corporation, Armonk, N.Y.

[21] Appl. No.: 518,903

[22] Filed: Aug. 24, 1995

[51] Int. Cl.[6] .................. C23C 18/36; C23C 18/50
[52] U.S. Cl. .............. 106/1.22; 106/1.25; 427/437; 427/443.1
[58] Field of Search ................ 106/1.22, 1.25; 427/437, 443.1

[56] References Cited

U.S. PATENT DOCUMENTS

| | | | |
|---|---|---|---|
| 3,915,717 | 10/1975 | Feldstein et al. | 106/1.23 |
| 3,930,896 | 1/1976 | Takahama et al. | 106/1.11 |
| 4,078,096 | 3/1978 | Redmond et al. | 106/1.24 |
| 4,632,857 | 12/1986 | Mallory, Jr. | 427/98 |
| 5,203,911 | 4/1993 | Sricharoenchaikit et al. | 106/1.27 |

Primary Examiner—Helene Klemanski
Attorney, Agent, or Firm—Stephen S. Strunck

[57] ABSTRACT

A process for electrolessly depositing cobalt-tin alloys with adjustable tin contents from 1 to over 25 atomic percent tin is disclosed. The deposited alloy is useful in the electronics and computer industries for device, chip interconnection and packaging applications. When used for chip interconnection applications, for example, the invention replaces the currently used complicated ball-limiting-metallurgy. The invention may also be used to inhibit hillock formation and electromigration in copper wire structures found in computers and micron dimension electronic devices.

9 Claims, 5 Drawing Sheets

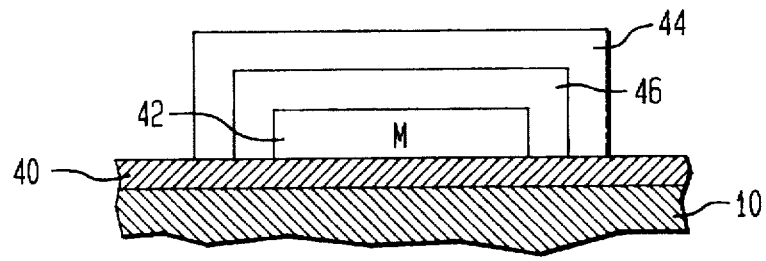
FIG. 4A
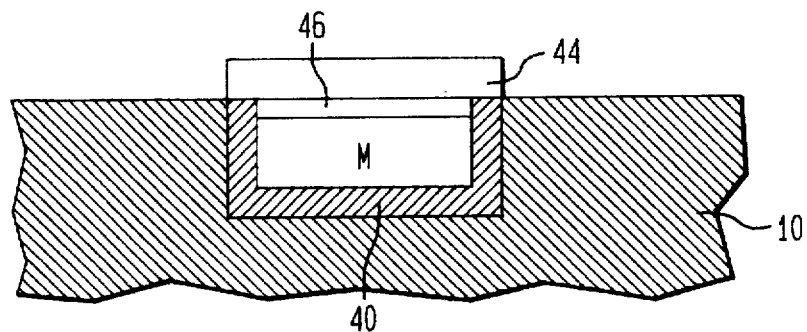
FIG. 4B
FIG. 5
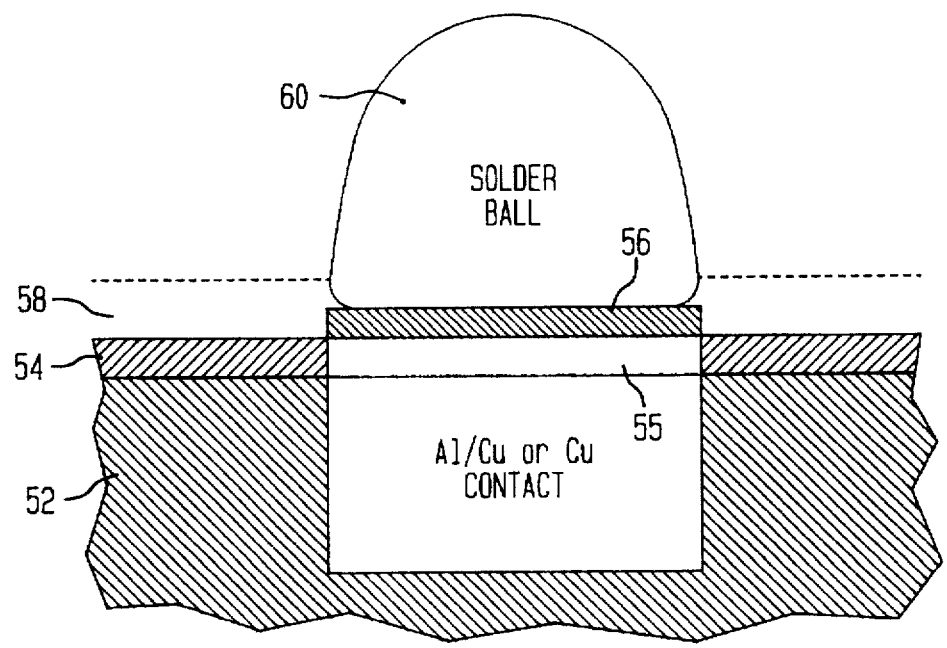

COBALT-TIN ALLOYS AND THEIR APPLICATIONS FOR DEVICES, CHIP INTERCONNECTIONS AND PACKAGING

BACKGROUND OF THE INVENTION

1. Field of the Invention

The present invention relates generally to a process for electrolessly depositing cobalt-tin alloys with adjustable tin contents from 1 to over 25 atomic percent. The deposited alloys have uses principally in the microelectronics industry in device, chip interconnection and packaging applications.

2. Description of the Related Art

The present invention addresses several problems encountered in electronics for computer circuits and also for chip attachment to printed circuit boards and other substrates. One key problem found in electronic circuits made of fine Cu lines is the migration of Cu under applied current. This metal migration (known as electromigration) affects the circuit integrity. The present state of the art for preventing this electromigration, which manifests itself in hillock formation and corrosion effects is to apply a barrier layer around the structure: barrier layers can be made by deposition of other metals (for examples, Ta, Cr, Ti and TaN), and even dielectric layering over the Cu lines, but they are usually expensive and affect other properties of the Cu thin film circuit. The present invention introduces a much more effective solution to this problem.

In interconnection technology (e.g., soldering, controlled collapse chip connection (C4)), the material which is soldered to is typically copper, nickel, or gold. These metallurgies exhibit a considerable contact resistance per unit area which may limit miniaturization of interconnections and require higher than necessary power consumption and heat evolution.

Typical C4 interconnection technology is illustrated in FIG. 1. The basic idea of C4 is to connect chips, chip packages, or such other units by means of solder bumps (sometimes referred to as solder balls) partially crushed between two surfaces of the units. One surface is the chip, the other is the substrate that the chip is attached to. These tiny bumps of electrically conductive solder bridge the gaps between respective pairs of metal pads on the units being connected. Each pad has a corresponding pad on the other unit's surface; the pad arrangements are mirror images. AS the units are pressed together the solder bumps on the pads of the first unit are pressed against corresponding conductive pads (having no bumps) on the second unit, partially collapsing the solder bumps and making connections between respective pads.

One technique for making solder bumps is electrodeposition, also called electrochemical plating or electroplating. Solder bump electrodeposition requires a first preliminary step, the creation of a continuous "seed layer" of conductive metal adhered onto the insulating substrate. The seed layer is needed to conduct the electricity which deposits solder.

FIG. 1A shows a wafer substrate S whose surface is overlaid with a conductive layer L1 of chromium (Cr) This metal layer, which will function as part of the seed layer for electrodepositing solder bumps, might be a ten-thousandth of a millimeter thick. On top of the Cr is deposited a thin "phased" layer L2 of 50% chromium-50% copper (Cr-Cu) resulting from the simultaneous sputtering of Cr and Cu. Finally, a third layer L3 of pure copper is deposited over all of the wafer. The Cr, Cr-Cu, and Cu layers are of comparable thicknesses. (FIG. 1A shows atop the seed layers L1-L3 a solder bump B and mask M, which are added in later steps. The first step of coating the substrate S is done on a bare substrate surface.)

The second preliminary step, after the seed layer is laid down, is to form a mask by photolithography. A layer of photoresist is laid onto the seed layer and exposed to light. Unexposed photoresist can then be washed away to leave the cured photoresist behind as a mask. Cured photoresist is shown in FIG. 1A as part of the mask M.

When the exposed photoresist has been cured and the uncured photoresist has been removed, the mask is complete. The mask has rows of holes where the solder bumps are to be deposited.

The third step is electrodeposition (electroplating) of lead alloy into the mask holes. An electrodeposited solder bump B is shown in FIG. 1A. The solder bump B might be ¼ millimeter thick; the thickness of the seed layers L1-L3 is exaggerated in FIG. 1A for clarity.

Solder bump B contains tin (Sn) and so will adhere well to the uppermost copper layer. The two metals react to form an "intermetallic," $Cu_xSn_y$ (for example, $Cu_3Sn$). The phased Cr-Cu layer L2 holds the Cr and Cu layers together, and the Cr sticks well to the wafer.

After the solder bumps are formed, the mask of cured photoresist is removed. The substrate now is covered with the continuous seed layer and numerous solder bumps.

After the seed layer is deposited over the substrate and the C4 bumps have been formed, the seed layer is desirably removed in between the solder bumps to electrically isolate them.

FIG. 1B shows the seed layers removed to leave the solder bumps electrically isolated but mechanically fixed to the substrate. This is accomplished by etching the layers L1-L3 away with chemical or electrolytic action; in either case the solder bump B protects the layers under it. FIG. 1C shows a solder bump (or ball) B formed by melting, or reflowing, the solder ball B of FIGS. 1A-1B. The solder ball is now ready to make contact.

SUMMARY OF THE INVENTION

A process for electrolessly depositing cobalt-tin alloys with adjustable tin contents from 1 to over 25 atomic percent is disclosed. The tin content of the electrolessly deposited alloy is varied by tailoring the bath chemistry. The deposited alloy is useful in the electronics and computer industries for device, chip interconnection and packaging applications. When used for chip interconnection applications, for example, the invention replaces the currently used complicated ball-limiting-metallurgy. The invention may also be used to inhibit hillock formation and electromigration in copper wire structures found in computers and micron dimension electronic devices.

BRIEF DESCRIPTION OF THE DRAWINGS

The foregoing and other objects, aspects and advantages of the invention will be better understood from the following detailed description of the invention with reference to the drawings, in which:

FIG. 4A is a schematic of a hillock/electromigration barrier produced by the method of the invention.

FIG. 4B is a schematic of a second embodiment of a hillock/electromigration barrier produced by the method of the invention.

FIG. 5 is a schematic of a C4 BLM interconnect produced by the method of the invention.

DETAILED DESCRIPTION OF THE INVENTION

Figure 1A:
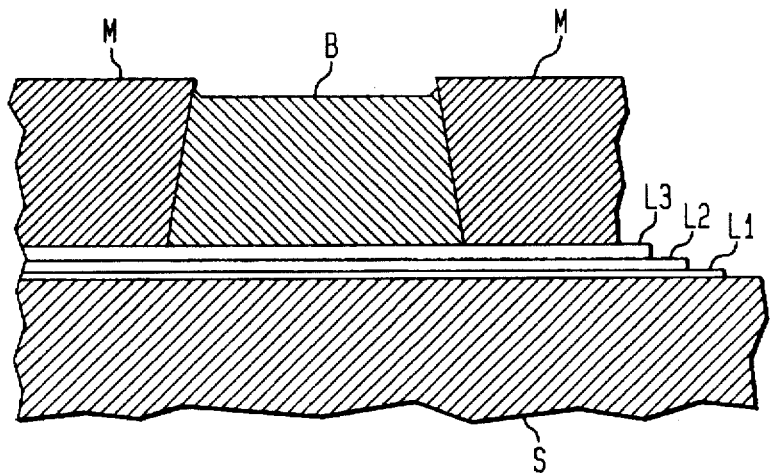
Figs. 1A-1C are elevational, cross-section views of C4 solder ball formation by electroplating in accordance with the prior art.

The main concept of this invention is a new process for the controlled deposition of certain cobalt-tin alloys. The composition of these alloys can be adjusted from 1% to over 25% atomic tin. The major technological advantages for the use of these new materials in the microelectronics industry is two fold: 1) In solder bonding applications, when a layer of Co-Sn is deposited onto a metal substrate pad (Cu, Ni, etc.) in accordance with this invention and solder is applied, the interface electrical resistance between the solder and Co-Sn is greatly reduced as compared to solder-Cu and solder-Ni and 2) The Co-Sn layer applied to copper conductors has been found to inhibit hillock formation during thermal annealing. This invention will have a very important beneficial effect in reducing electromigration in microelectronic circuits, especially those involving fine copper circuitry on silicon chips. Hillocks are anomalous metallurgical formations produced by the electromigration of copper under an applied current. These are fracture prone spots which also cause perturbations in the current flow in affected wires and other structures.

This invention entails the selective deposition of a complex cobalt-tin alloy containing also minor amounts of phosphorous or boron. The deposition occurs onto catalytically active conductor surfaces, usually copper wiring, nickel, palladium or cobalt. The deposition of the alloy can be made to occur selectively, because it is based on the autocatalytic or electroless process. A solution of cobalt and tin ions is autocatalytically reduced to the metallic state on a suitable surface when the solution is mixed with a reducing agent, either hypophosphite or DMAB (dimethylamino borane). The cobalt-tin alloys contain between 1 to 25% of tin, depending on the deposition conditions. The electroless deposit also contains a few atomic percent of phosphorous, when the reducing agent used is hypophosphite, or boron when the reducing agent is DMAB. The most common representation of these metal deposits is Co(Sn)(P) or Co(Sn) (B). In current practice, the solution containing Co and Sn ions is mixed with the reducing agent (either hypophosphite or dimethylamino borane). The solution is very stable with respect to spontaneous decomposition by plating out. When the solution is put into contact with an autocatalytic surface (for example, palladium, nickel, cobalt or palladium-seeded copper), the deposition of the Co-Sn alloy occurs.

The process of this invention allows the deposition of a cobalt-tin film containing between 1% to about 25% atomic tin, by tailoring the bath chemistry. For low percentages of tin (e.g., 1–3 at %), hypophosphite is selected as the reducing agent. However, for high atomic percent (e.g., 3–25) of tin in the cobalt film, the preferred reducing agent is dimethylamino borane (DMAB). Also, the bath giving low tin content in the film is simpler in composition as it uses a single chelating agent, citrate, for cobalt and tin ions. The percentage of Sn and Co in the deposit are changed by changing the ratio of Sn to Co in the bath. Ammonium hydroxide, sodium gluconate and mixtures of sodium gluconate and triethanolamine are used as buffers to control the pH of the solutions.

The following examples show the chemical composition of the cobalt-tin electroless bath selected to yield various levels of tin in the Co-Sn films. These novel compositions form part of this invention.

| One percent Sn in Co(P)        |          |
| ------------------------------ | -------- |
| tri-sodium citrate             | 85 mM    |
| sodium stannate                | 4 mM     |
| ammonium hydroxide             | 0.1 M    |
| cobalt sulfate                 | 22 mM    |
| sodium hypophosphite           | 95 mM    |
| FC 98 surfactant               | 1 mM     |
| pH                             | 8.6      |
| temperature                    | 75 C     |
| Three percent Sn in Co(B)      |          |
| sodium gluconate               | 106 mM   |
| sodium stannate                | 57 mM    |
| triethanolamine                | 68 mM    |
| glutamic acid                  | 121 mM   |
| cobalt sulfate                 | 82 mM    |
| lead acetate                   | 1.5 ppm  |
| FC 98 surfactant               | 1 mM     |
| dimethylamine borane           | 169 mM   |
| pH                             | 6.8      |
| temperature                    | 70 C     |
| Twenty-four percent Sn in Co(B)|          |
| sodium gluconate               | 14 mM    |
| sodium stannate                | 6 mM     |
| tri-sodium citrate             | 54 mM    |
| ammonium sulfate               | 152 mM   |
| cobalt sulfate                 | 21 mM    |
| lead acetate                   | 0.5 ppm  |
| FC 98 surfactant               | 1 mM     |
| dimethylamine borane           | 119 mM   |
| pH                             | 9.0      |
| temperature                    | 70 C     |

The invention is practiced generally by first preparing the solution by dissolving the respective (reagent quality) salts in pure water in a proper container, according to the proportions of concentrations desired. The solutions are stirred gently and heated to a temperature between 70° C. to 75° C.

Next, the electronic circuit or part that is to be electrolessly plated with a thin Co-Sn film is prepared. If the substrate is copper (either blanket film, or copper pads or fine lines) the copper substrate has to be "activated"by seeding it using a $PdSO_4$ solution as described in U.S. Pat. No. 5,380,560 which is incorporated herein by reference. Briefly, the activation process consists of precleaning the Cu substrates in a $H_2SO_4$- persulfate solution for 1 minute, rinsing thoroughly with distilled water, and then immersing the parts in a $PdSO_4$-$H_2SO_4$ solution for about 3 minutes, followed by rinsing with distilled water to eliminate the Pd residues in between the copper features.

The seeded and rinsed part is next immersed in the Co-Sn bath for about 10 min., which will produce a coating on the Cu substrate of a film of Co-Sn about 1000Å thick. Depending on the time of exposure and plating rate, a thicker film can be deposited.

Figure 2:
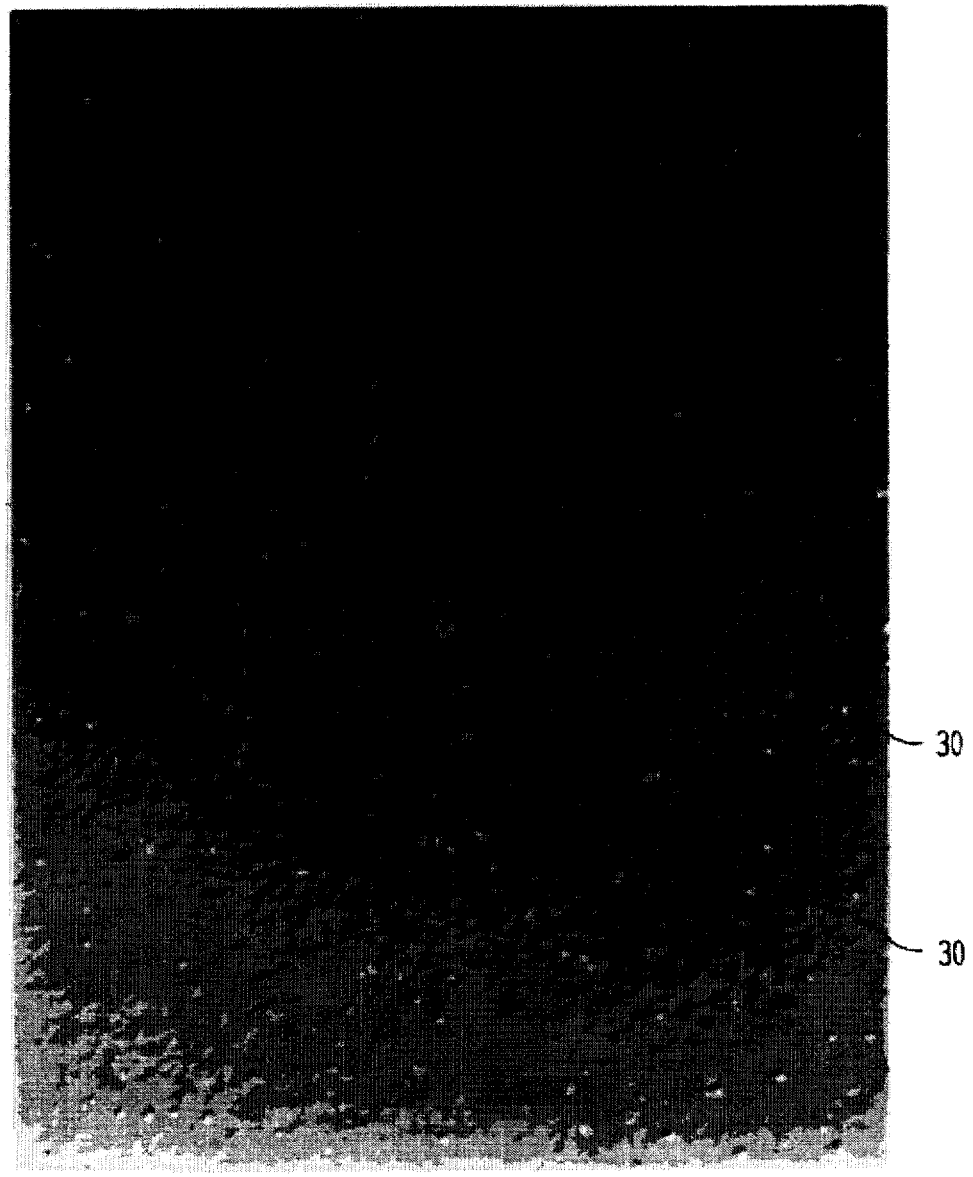
FIG. 2 is a micrograph of a control sample of an electrolessly deposited copper wire subsequent to heating at 400° C. for 2 hours.
Figure 3:
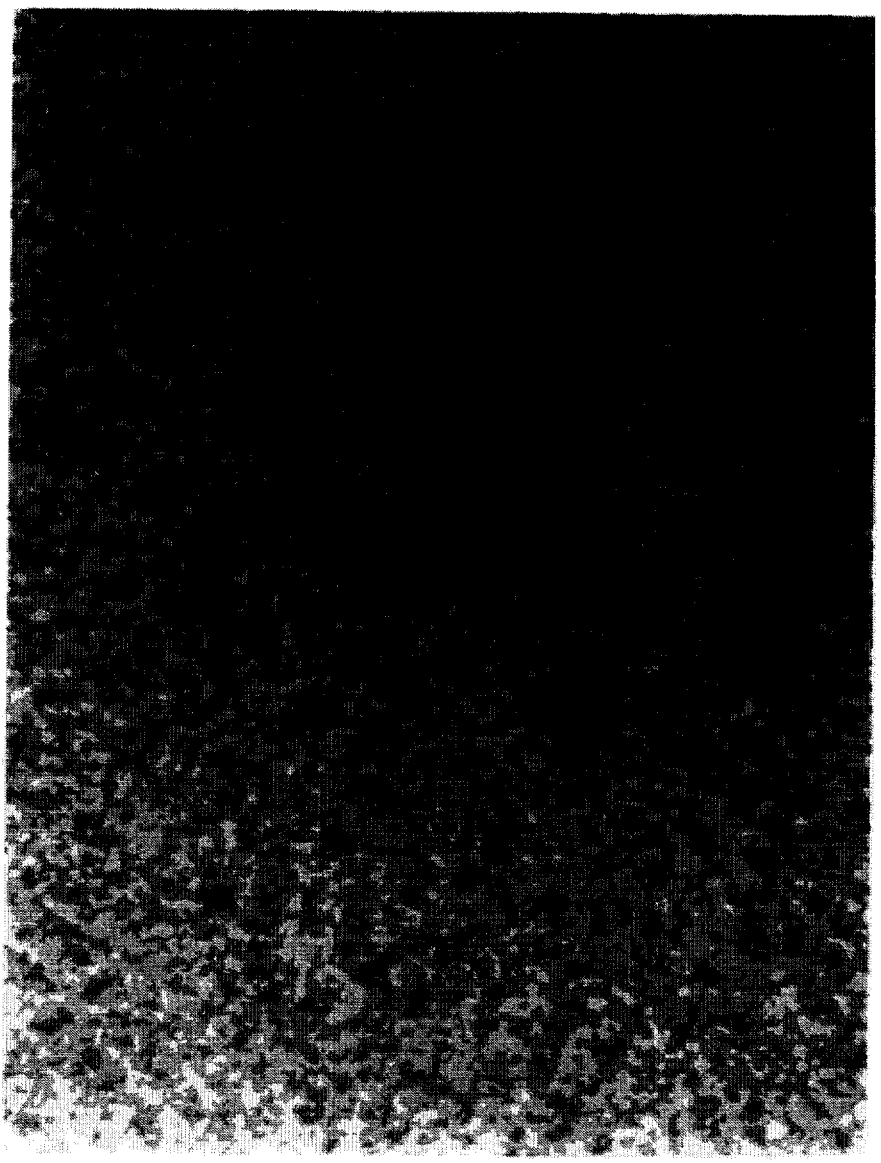
FIG. 3 is a micrograph of an electrolessly deposited copper wire protected by a 1000 Å thick Co-Sn film of the invention subsequent to heating at 400° C. for 2 hours.

The inhibition of hillock formation was determined by electroless deposition of a 1000Å Co-Sn film on Cu, with Sn content from 1–8% atomic Sn, using either Co(P) or Co(B) baths. The resulting specimens as well as a copper control sample (with no Co-Sn) were heated for two hours at 400° C. and inspected for hillocks using optical microscopy. Hillocks 30 were very abundant in the untreated (control) copper samples (FIG. 2) but were absent from those containing any tin (FIG. 3). While FIG. 3 is for the case of 6 at % Sn in a 1000–2000Å thick Co film, similar results were obtained for deposits having as little as 1 at % Sn and upwards of 19% Sn.

FIG. 4A shows one embodiment of a device structure, e.g., a copper wire, protected with a hillock/electromigration barrier of the invention. In this embodiment, barrier layer 40 (e.g., Ta) is deposited on substrate 10 and the Cu metal wire structure 42 is deposited (as by plating) on barrier layer 40. Thereafter, the wire structure is activated, as described above, then the Co-Sn electromigration barrier 44 of this invention is electrolessly deposited over the wire structure. The Co-Sn layer is heated to 250° C. to diffuse a small amount of Sn into the surface of the copper. It has been determined that this trace amount of Sn diffused into the copper is enough to modify the Cu grain structure and growth characteristics to inhibit hillock formation. The excess Co-Sn layer can be removed after heat treatment if desired by plasma etching which will leave intact the interdiffused tin as a tin enriched copper surface 46.

FIG. 4B shows another embodiment of a copper wire protected with a hillock/electromigration barrier of the invention. In this embodiment, the device structure, here wire 42, is deposited into U-channel barrier layer 40 previously formed in substrate 10. Subsequently, the wire structure is activated, as described above, then the Co-Sn electromigration barrier 44 of this invention is electrolessly deposited over the wire structure. Here, again, the Co-Sn layer may be removed after heat treatment to leave an electromigration barrier 46 comprising a Sn enriched Cu surface layer.

The present invention has also been used for applying a Co-Sn film to copper pads to facilitate soldering. The process generally involved cleaning the Cu pad, seeding with PdSO$_4$, rinsing, electrolessly plating a 1000Å thick layer of Co-Sn on the Cu pad and applying the solder as a structure overlying the Co-Sn layer.

The solder can be in the form of solder paste or a C-4 type ball can be applied. In an example, soldering experiments were performed using eutectic PbSn solder with a flux and the total bond resistance was compared with those of copper and Co-P-Sn treated samples. In all cases and at all Sn contents of 3 atom % and above, the total bond resistance of those having the Co-Sn film was 10% or less of that of the samples without the Co-Sn film.

Selectivity of the Co-Sn deposition process of this invention was tested using patterned copper wiring on silicon with SiO$_2$ as dielectric. Line widths were of the order of 2 microns. No bridging was found in between lines. Extraneous metal deposition did not occur on the dielectric surface between the lines.

Figure 1B:
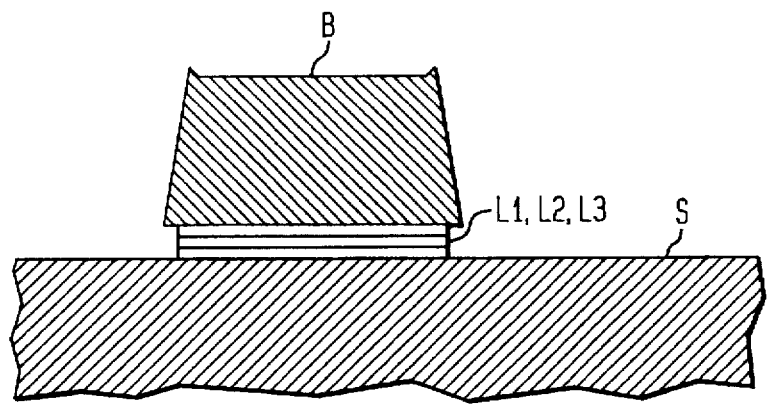
Figure 1C:
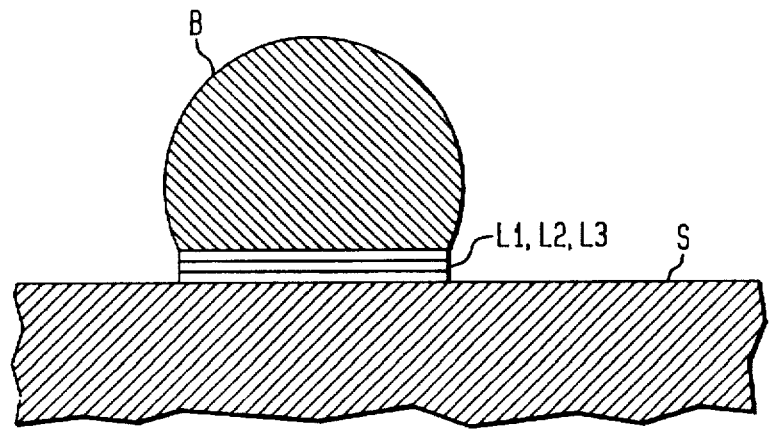

FIG. 5 shows an alternative C4 BLM structure made with the practice of this invention. In making this structure, a contact pad 50 of Al-Cu is fashioned by conventional means in a substrate 52 (e.g., SiO$_2$). Layer 54 of SiN is provided by sputter deposition process as an insulator layer. Optionally, a polyimide layer 58 can be applied for further defining the BLM and for containing the solder ball. Next layer 55 (about 3–8 microns) or Ni or Co is deposited onto the Cu/Al or Cu contact. The Co-Sn-P or Co-Sn-B of this invention is electrolessly deposited next as layer 56 (1000–2000Å). Lastly, solder ball 60 is provided using conventional processing technology. The difference between the presently practiced C4 BLM technology and the more simplified structure made possible by this invention may readily be observed by comparing FIGS. 1 and 5 respectively.

Figure 6:
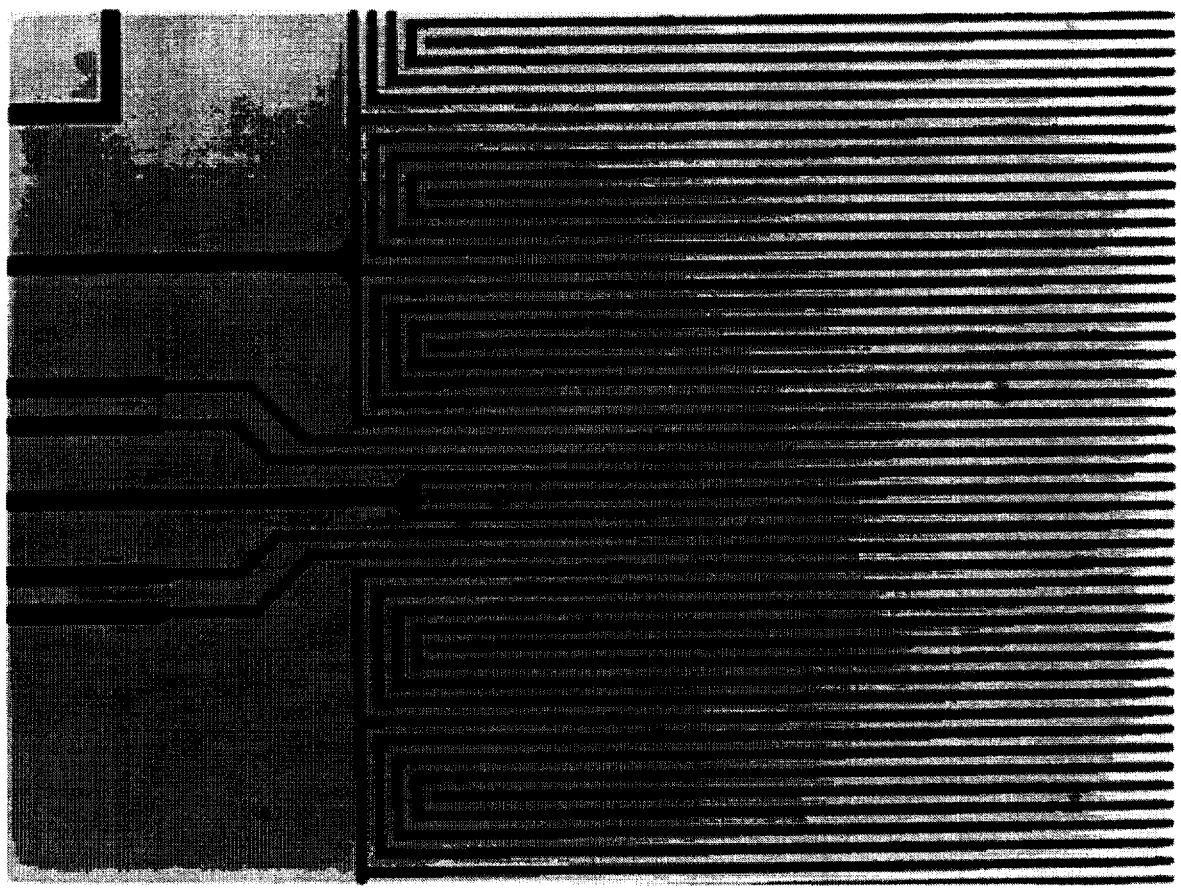
FIG. 6 is a photograph of a copper wire array showing the ability of the method of the invention to electrolessly deposit Co-Sn films selectively without bridging between adjacent wires.

Selectivity of the Co-Sn deposition was tested using patterned copper wiring on silicon with SiO$_2$ as the dielectric. Line widths were of the order of 2 microns. As may be observed from FIG. 6, no bridging was found in between lines.

In general, it is to be understood that the inventions includes all variations within the scope of the following claims, and is not limited to the particular embodiments and examples used to illustrate and describe the invention.

Having thus described our invention, what we claim as new and desire to secure by letters patent is as follows:

1. A solution for the electroless deposition of cobalt-tin-phosphorus alloys comprising:

a) a cobalt salt plus a tin salt;

b) a complexing agent;

c) a phosphorus-bearing reducing agent; and d) a buffer.

2. The solution of claim 1 wherein said cobalt salt is cobalt sulfate and said tin salt is sodium stannate.

3. The solution of claim 1 wherein said reducing agent is hypophosphite.

4. The solution of claim 1 wherein said complexing agent is sodium citrate.

5. The solution of claim 1 wherein said buffer is ammonium hydroxide.

6. A method for the selective deposition of a Co-Sn-P alloy onto one or more device structures in a device comprising:

(a) preparing the plating bath of claim 1;

(b) activating the surfaces of said device structures;

(c) rinsing said device;

(d) immersing said device in said plating bath.

7. A solution for the electroless deposition of cobalt-tin-phosphorus alloys comprising:

a) about 85 mm tri-sodium citrate;

b) about 4 mM sodium stannate;

c) about 0.1 M ammonium hydroxide;

d) about 22 mM cobalt sulfate; and e) about 95 mM sodium hypophosphite.

8. The solution of claim 7 further including about 1 mM surfactant.

9. The solution of claim 7 having a pH of about 8.6.

* * * * *